(12) United States Patent
van Eeden et al.

(10) Patent No.: US 10,153,757 B2
(45) Date of Patent: Dec. 11, 2018

(54) THREE INPUT COMPARATOR

(71) Applicant: Microchip Technology Incorporated, Chandler, AZ (US)

(72) Inventors: Jacobus Albertus van Eeden, Chandler, AZ (US); Yong Yuenyongsgool, Gilbert, AZ (US); Keith Curtis, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 139 days.

(21) Appl. No.: 15/060,539

(22) Filed: Mar. 3, 2016

(65) Prior Publication Data

US 2016/0261258 A1  Sep. 8, 2016

Related U.S. Application Data

(60) Provisional application No. 62/129,435, filed on Mar. 6, 2015.

(51) Int. Cl.
*H03K 5/24* (2006.01)
*H03K 19/21* (2006.01)
*H02M 3/158* (2006.01)
*H03K 7/08* (2006.01)

(52) U.S. Cl.
CPC ............. *H03K 5/24* (2013.01); *H02M 3/158* (2013.01); *H03K 5/2481* (2013.01); *H03K 7/08* (2013.01); *H03K 19/21* (2013.01)

(58) Field of Classification Search
CPC ...... H03K 5/2481; H03K 19/21; H03K 5/249; H03K 7/02; H03K 7/08; H03K 5/24

USPC .............................................. 327/74, 75, 77
See application file for complete search history.

(56) References Cited

U.S. PATENT DOCUMENTS

| 4,549,151 A | 10/1985 | Kaneko ...................... 332/110 |
| 4,737,721 A | 4/1988 | Lippl .......................... 327/116 |
| 4,760,354 A * | 7/1988 | Kianush ................. H03C 1/60 332/108 |

(Continued)

FOREIGN PATENT DOCUMENTS

| CN | 103208980 A | 7/2013 | .............. G05F 1/56 |
| EP | 0261451 A1 | 3/1988 | ............. G01D 5/243 |
| EP | 0360888 A1 | 4/1990 | ............ H02M 3/156 |

OTHER PUBLICATIONS

Partial International Search Report and Written Opinion, Application No. PCT/US2016/020848, 6 pages, dated Jun. 9, 2016.

(Continued)

*Primary Examiner* — John Poos
(74) *Attorney, Agent, or Firm* — Slayden Grubert Beard PLLC

(57) ABSTRACT

A three input voltage comparator provides termination of a pulse width modulation (PWM) output in a switched mode power supply. Shutdown of the PWM signal occurs when a sense current from the switching transistors exceeds either or both of the limit and error current references. The three input voltage comparator replaces the generally used two input voltage comparator and also eliminates the necessity of having to provide a voltage clamping circuit on the output of the voltage error amplifier in the switched mode power supply. The three input voltage comparator may also comprise selectable polarity control for more versatile integration of it into a switched mode power supply design.

23 Claims, 6 Drawing Sheets

(56) References Cited

U.S. PATENT DOCUMENTS

| | | | | |
|---|---|---|---|---|
| 4,859,872 | A | | 8/1989 | Hyakutake ................... 327/74 |
| 5,049,761 | A | | 9/1991 | Zitta ............................ 327/172 |
| 5,887,028 | A | * | 3/1999 | Araki .................. H04B 1/1646 |
| | | | | 329/361 |
| 7,298,209 | B1 | | 11/2007 | Sutardja ................... 330/207 A |

OTHER PUBLICATIONS

International Search Report and Written Opinion, Application No. PCT/US2016/020848, 19 pages, dated Sep. 12, 2016.

* cited by examiner

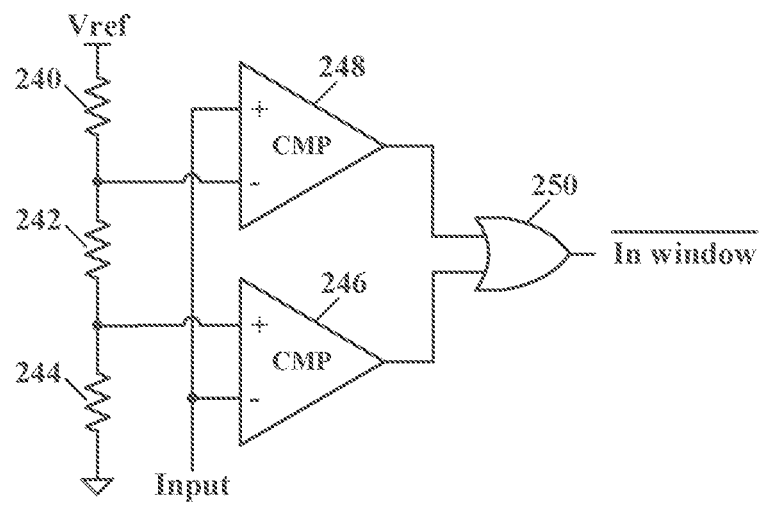
(a)
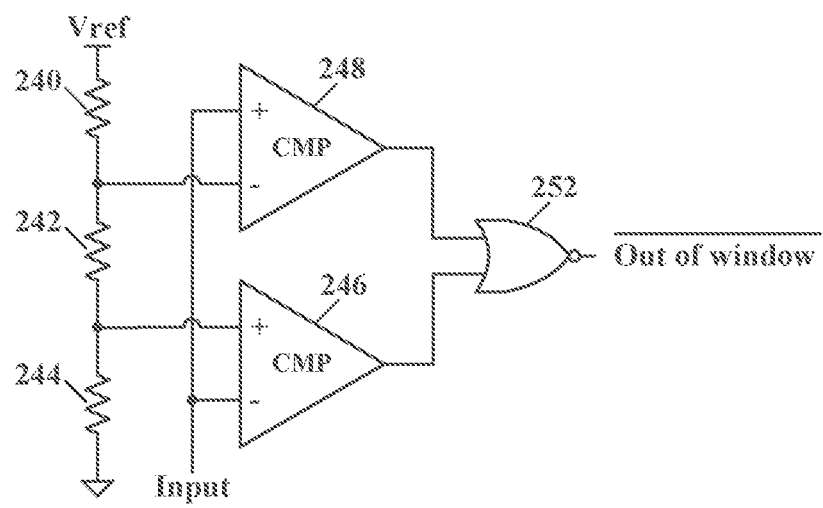
(b)
Figure 2 (Prior Art)

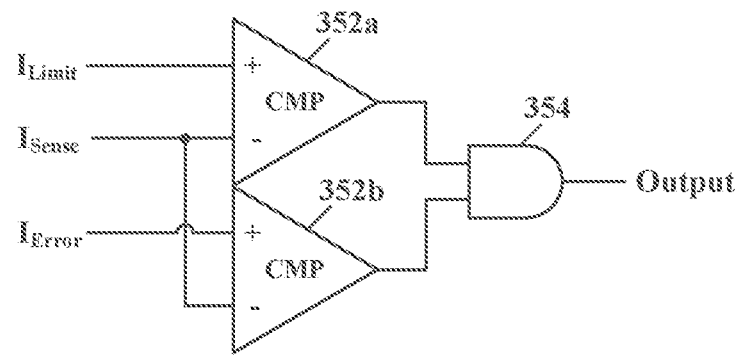
(a)
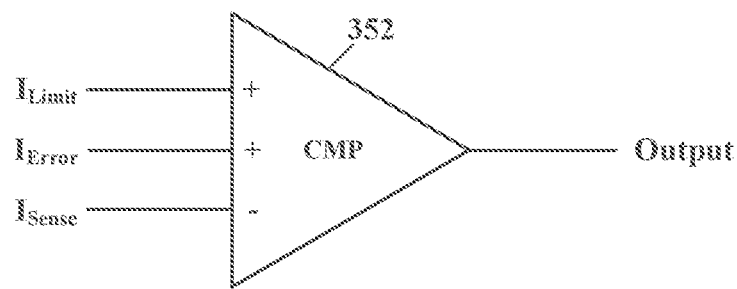
(b)
Figure 3

Input < Ref. A = 1
Input < Ref. B = 1

| Input < Ref. B | Input < Ref. B | Polarity A | Polarity B | Polarity | Output | | Note |
|---|---|---|---|---|---|---|---|
| 0 | 0 | 0 | 0 | 0 | 0 | input > Ref. A & input > Ref. B | |
| 0 | 1 | 0 | 0 | 0 | 0 | input > Ref. A & input < Ref. B | |
| 1 | 0 | 0 | 0 | 0 | 0 | input < Ref. A & input > Ref. B | |
| 1 | 1 | 0 | 0 | 1 | 1 | input < Ref. A & input < Ref. B | |
| 0 | 0 | 0 | 1 | 1 | 1 | input > Ref. A & input > Ref. B | Note 1 |
| 0 | 1 | 0 | 1 | 1 | 1 | input > Ref. A & input < Ref. B | Note 2 |
| 1 | 0 | 1 | 0 | 0 | 0 | input < Ref. A & input > Ref. B | Note 3 |
| 0 | 1 | 1 | 0 | 0 | 1 | input > Ref. A & input < Ref. B | Note 4 |
| 1 | 1 | 1 | 1 | 1 | 1 | input < Ref. A & input < Ref. B | Note 5 |

Note 1: Window comparator outside window SMPS control current limit.
Note 2: SMPS control current at error voltage.
Note 3: Window comparator high.
Note 4: Window comparator in window.
Note 5: Window comparator low, SMPS control current low.

Figure 5

THREE INPUT COMPARATOR

RELATED PATENT APPLICATION

This application claims priority to commonly owned U.S. Provisional Patent Application No. 62/129,435 filed Mar. 6, 2015; which is hereby incorporated by reference herein for all purposes.

TECHNICAL FIELD

The present disclosure relates to switched mode power supplies, and, in particular, to comparators used in switched mode power supplies.

BACKGROUND

Switched mode power supplies may have in addition to output voltage control a current control mode. The current control mode may be used to prevent overload of the power supply and also prevent saturation of the power inductor. However to provide for these current protection features in the switched mode power supplies, components external to the controller of the switched mode power supply may be required, and may also burden the output of an operational amplifier within the controller when using an external fixed voltage clamp.

SUMMARY

Therefore a need exists for current control features in a switched mode power supply that may be provided within the controller and not burden circuit operation thereof.

According to an embodiment, a three input voltage comparator may comprise: a first input; a second input; a third input; and an output that may have either at a first or second logic level, wherein when voltages on: the first input may be less than the second and third inputs the output may be at the first logic level, the first input may be greater than the second and less than the third input the output may be at the second logic level, the first input may be greater than the second and third inputs the output may be at the second logic level, and the first input may be less than the second and greater than the third input the output may be at the second logic level.

According to a further embodiment, the first logic level may be a high logic level and the second logic level may be a low logic level. According to a further embodiment, wherein the first logic level may be a low logic level and the second logic level may be a high logic level. According to a further embodiment, the first and third inputs may be non-inverting inputs and the second input may be an inverting input.

According to another embodiment, a three input voltage comparator having output polarity control may comprise: a first voltage comparator having a first input, a second input and a first output; a second voltage comparator having a third input and the second input in common with the first voltage comparator, and a second output; a first exclusive OR gate having a first input coupled to the output of the first voltage comparator and a second input coupled to a first polarity selection signal; a second exclusive OR gate having a first input coupled to the output of the second voltage comparator and a second input coupled to a second polarity selection signal; an AND gate having a first input coupled to an output of the first exclusive OR gate and a second input coupled to an output of the second exclusive OR gate; and a third exclusive OR gate having a first input coupled to the output of the AND gate, a second input coupled to a third polarity selection signal, and a third output.

According to a further embodiment, the first and third inputs may be non-inverting inputs and the second input may be an inverting input. According to a further embodiment, when a voltage on the second input may be greater than voltages on the first and third inputs of the voltage comparators then the third output of the third exclusive OR gate may be at a logic low when the first, second and third polarity selection signals may be at the logic low. According to a further embodiment, when a voltage on the second input may be greater than a voltage on the first input and less than a voltage on the third input of the voltage comparators then the third output of the third exclusive OR gate may be at a logic low when the first, second and third polarity selection signals may be at the logic low. According to a further embodiment, when a voltage on the second input may be less than a voltage on the first input and greater than a voltage on the third input of the voltage comparators then the third output of the third exclusive OR gate may be at a logic low when the first, second and third polarity selection signals may be at the logic low. According to a further embodiment, when a voltage on the second input may be less than voltages on the first and third inputs of the voltage comparators then the third output of the third exclusive OR gate may be at a logic high when the first, second and third polarity selection signals may be at a logic low. According to a further embodiment, when a voltage on the second input may be greater than voltages on the first and third inputs of the voltage comparators then the third output of the third exclusive OR gate may be at a logic high when the first polarity selection signal may be at a logic low, and the second and third polarity selection signals may be at the logic high. According to a further embodiment, when a voltage on the second input may be greater than the voltage on the first input and less than the voltage on the third input of the voltage comparators then the third output of the third exclusive OR gate may be at a logic high when the first polarity selection signal may be at a logic low, and the second and third polarity selection signals may be at the logic high.

According to a further embodiment, when a voltage on the second input may be less than the voltage on the first input and greater than the voltage on the third input of the voltage comparators then the third output of the third exclusive OR gate may be at a logic low when the first polarity selection signal may be at the logic low, and the second and third polarity selection signals may be at a logic high. According to a further embodiment, when a voltage on the second input may be less than the voltages on the first and third inputs of the voltage comparators then the third output of the third exclusive OR gate may be at a logic high when the first polarity selection signal may be at a logic low, and the second and third polarity selection signals may be at the logic high. According to a further embodiment, when a voltage on the second input may be greater than the voltages on the first and third inputs of the voltage comparators then the third output of the third exclusive OR gate may be at a logic high when the first polarity selection signal may be at the logic high, the second polarity selection signal may be at a logic low, and the third polarity selection signal may be at the logic high. According to a further embodiment, when a voltage on the second input may be greater than the voltage on the first input and less than the third input of the voltage comparators then the third output of the third exclusive OR gate may be at a logic low when the first polarity selection signal may be at a logic high, the second polarity selection signal may be at the logic low, and the third polarity selection signal may be at the logic high. According to a further embodiment, when a voltage on the second input may be less than the voltage on the first input and greater than the third input of the voltage comparators then the third output of the third exclusive OR gate may be at a logic high when the first polarity selection signal may be at the logic high, the second polarity selection signal may be at a logic low, and the third polarity selection signal may be at the logic high. According to a further embodiment, when a voltage on the second input may be less than the voltages on the first and third inputs of the voltage comparators then the third output of the third exclusive OR gate may be at a logic high when the first polarity selection signal may be at the logic high, the second polarity selection signal may be at a logic low, and the third polarity selection signal may be at the logic high.

According to yet another embodiment, a switched mode power supply may comprise an error amplifier generating an output signal coupled to a three input voltage comparator, wherein the three input voltage comparator may compare the output signal of the error amplifier with two additional reference input signals and may produce an output of a first or second logic level dependent upon the comparison results thereof. According to a further embodiment, a complementary output generator (COG) may have an input coupled to the output of the three input voltage comparator, wherein a pulse width modulation (PWM) signal from the COG may be enabled when the output of the three input voltage comparator may be at a first logic level and terminated when at a second logic level. According to a further embodiment, the two additional reference signals may be a current error signal and a current limit signal. According to a further embodiment, the three input voltage comparator, error amplifier and COG may be provided in a microcontroller that may be also used as a PWM generator in the switched mode power supply.

BRIEF DESCRIPTION OF THE DRAWINGS

A more complete understanding of the present disclosure may be acquired by referring to the following description taken in conjunction with the accompanying drawings wherein:

FIG. 2 illustrates schematic block diagrams of prior art widow comparators for determining in window and out of window signal voltage amplitudes;

FIG. 3 illustrates schematic block diagrams of a three input voltage comparator, according to specific example embodiments of this disclosure;

FIG. 5 illustrates a table of input combinations and resulting outputs of the three input voltage comparator circuit shown in FIG. 4.

Figure 1:
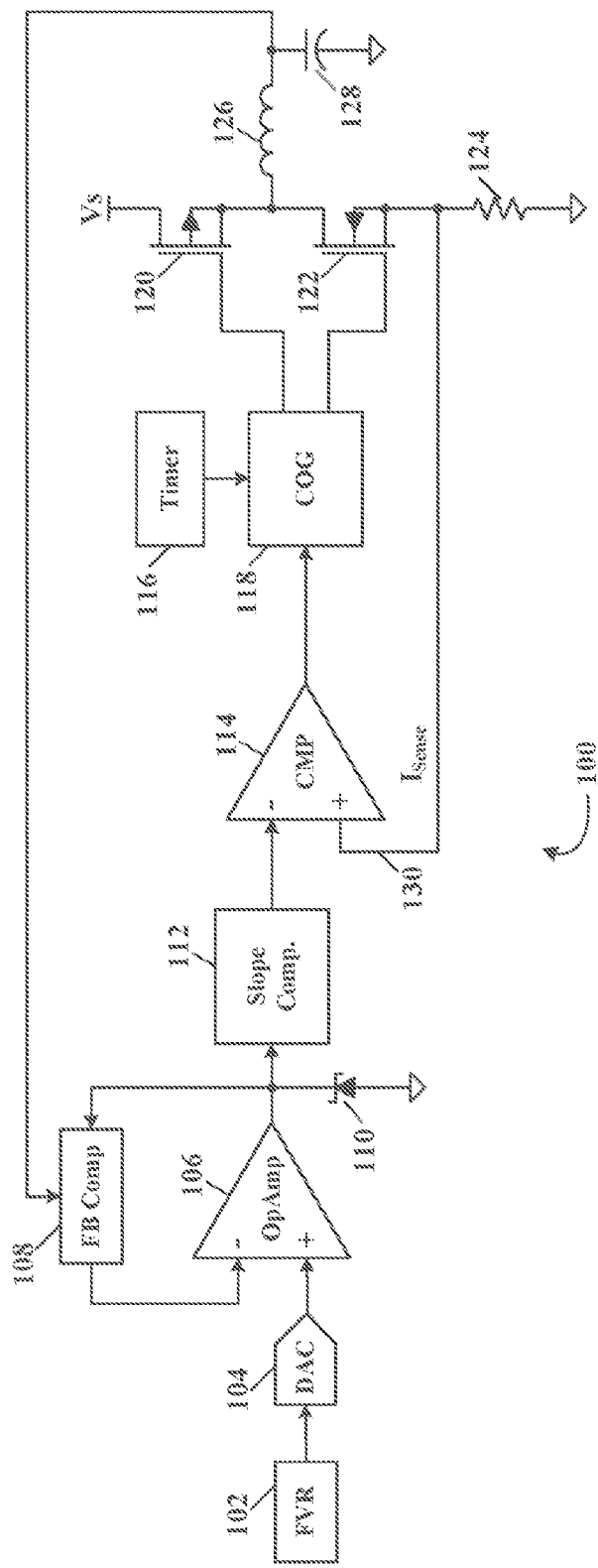
FIG. 1 illustrates a schematic block diagram of a typical prior art switched mode power supply having output clamping to prevent power inductor current saturation by using a Zener diode.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

DETAILED DESCRIPTION

Conventional analog switched mode power supply controllers are capable of current control mode. Such a device, for example but not limited to, is a high-speed, microcontroller-adaptable, pulse width modulator, model MCP 1630, manufactured by the Assignee of this application, information thereof available at www.microchip.com, and is hereby incorporated by reference herein for all purposes. A microcontroller with integrated comparators and configurable logic may be used to design a switched mode power supply with a minimum of external components. Typically a fixed voltage clamp may be used at the output of the voltage control loop operational amplifier in present technology controller circuits.

There exists however a need for the current control mode feature without burdening the output of the operational amplifier in the controller by being able to eliminate the fixed voltage clamp at the output of the operational amplifier. According to various embodiments, a circuit can be provided to limit the maximum inductor current of a switch mode power supply by using a third input to a current loop comparator in the controller. Hence, a switched mode power supply may be provided with a comparator with a hard current limit.

The specific example embodiments presented herein provide for the following advantages: A three input comparator is less expensive than using a second separate voltage comparator. According to the teachings of this disclosure and claimed herein, a three input voltage comparator may provide a single bias network and an inverting multiplexer that saves having to use a configurable logic cell (CLC) block of a microcontroller; provides for a smaller special function register (SFR) footprint, and may be used to generate a window and power supply comparator that allows for a fixed current limit and also allows for programmable current limits.

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of a typical prior art switched mode power supply having output clamping to prevent power inductor current saturation by using a Zener diode. This prior art switched mode power supply, generally represented by the numeral 100, may comprise a fixed voltage reference (FVR) 102, a digital-to-analog converter (DAC) 104, an operational amplifier (OpAmp) 106, a feedback compensation (FB Comp) network 108, a Zener clamping diode 110 on the output of the OpAmp 106, a peak current mode control (PCMC) slope compensation network 112, a voltage comparator 114, a timer 116, a complementary output generator (COG) 118, a high-side power switch (P-channel MOSFET) 120, a low-side power switch (N-channel MOSFET) 122, a current measurement sensor (e.g., resistor) 124, a power inductor 126, and a filter capacitor 128. Operation of this type of switched mode power supply is well known to those skilled in the art of switched mode power supply design.

A reference voltage from the DAC 104 is coupled to the non-inverting input of the OpAmp 106, and a voltage on the filter capacitor 128 is coupled to the FB Comp network 108 which is further coupled to the inverting input of the OpAmp 106. The OpAmp 106 is used as a voltage error amplifier. The output of the OpAmp 106 is clamped by the Zener diode 110 to hard limit its output to prevent current saturation of the power inductor 126 which may cause pulse width modulation (PWM) runaway when the OpAmp 106 circuit is saturated at the high voltage rail. When the Zener diode 110 clamps the output voltage from the OpAmp 106 it will draw maximum current therefrom, thus using unnecessary power and putting a strain on the OpAmp 106 circuit transistors. A better way to prevent current saturation of the power inductor 126 is disclosed hereinafter without the inherent drawbacks of using a Zener diode clamp.

Referring to FIG. 2, depicted are schematic block diagrams of prior art widow comparators for determining in window and out of window signal voltage amplitudes. In power supply application, the Zener clamp diode draws maximum current on the output of the OpAmp 106 as disclosed above. Window comparators require two separate and independent comparators 246 and 248, and a configurable logic cell (CLC) module of a microcontroller, e.g., gate 250 or 253. In addition, voltage divider resistors 240, 242 and 244 are required to provide multiple reference voltages for use by the comparators 246 and 248. A lower power, less complicated and cheaper solution is needed and disclosed herein.

Referring to FIG. 3, depicted are schematic block diagrams of a three input voltage comparator, according to specific example embodiments of this disclosure. Schematically represented for discussion purposes are two comparators 352a and 352b and an AND logic gate 354 (FIG. 3(a)). When the current sense ($I_{Sense}$) input exceeds either the error current ($I_{Error}$) or limit current ($I_{Limit}$), the output of the AND gate 354 goes to a logic low as does the output of the three input comparator 352 go to a logic low (FIG. 3(b)). This provides normal current control operation, while also providing a hard current limit. In actual implementation, the two comparators 352a and 352b would be combined into a single comparator 352 circuit having one output and three analog input voltage comparison circuits, thus removing the need for the logic gate 354.

The purpose of the three input comparator 352 is twofold: 1) The current sense input ($I_{Sense}$) is compared to the error current ($I_{error}$) reference and when the current sense ($I_{Sense}$) exceeds the error current ($I_{Error}$) value, the output of the comparator 352 goes to a logic low, thereby terminating the PMW pulse from the PWM generator. And 2) if the error current ($I_{error}$) signal is locked high due to a saturation condition in the error amplifier OpAmp 106, the comparator 352 output will still go low when the current sense ($I_{Sense}$) signal exceeds the limit current ($I_{Limit}$) reference value.

The following table comprises a logic table of the three input comparator 352 shown in FIG. 3 with limit current ($I_{Limit}$) and error current ($I_{error}$) comparison capability as follows:

|   | Condition | Output |
|---|---|---|
| 1 | ($I_{Sense} < I_{error}$) & ($I_{Sense} < I_{Limit}$) | 1 |
| 2 | ($I_{Sense} > I_{error}$) & ($I_{Sense} < I_{Limit}$) | 0 |
| 3 | ($I_{Sense} > I_{error}$) & ($I_{Sense} > I_{Limit}$) | 0 |
| 4 | ($I_{Sense} < I_{error}$) & ($I_{Sense} > I_{Limit}$) | 0 |

Figure 4:
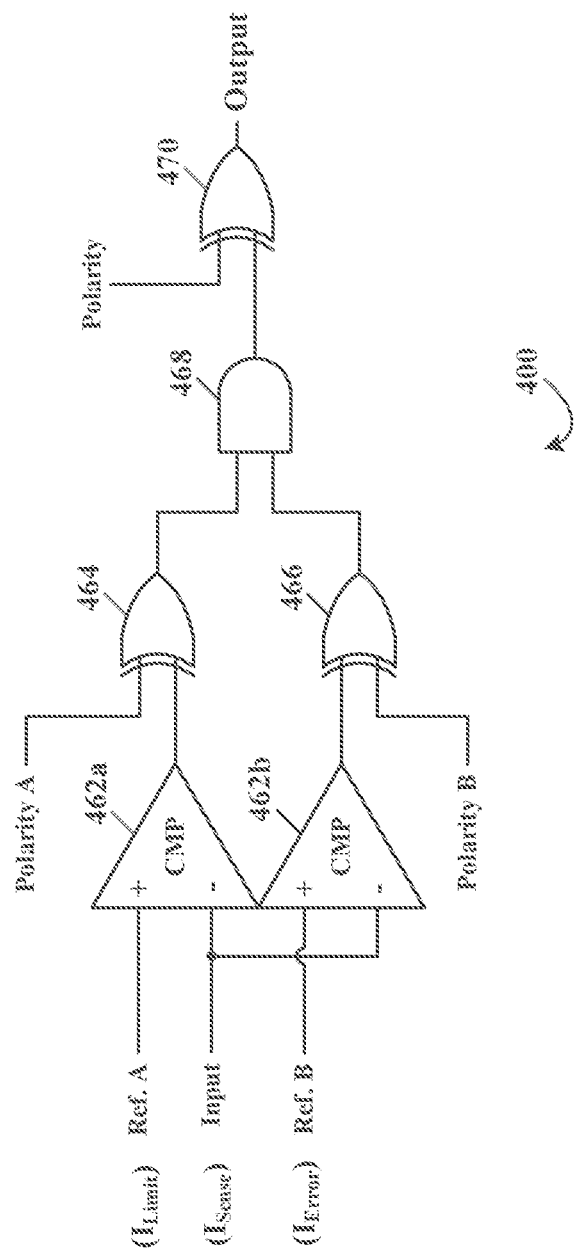
FIG. 4 illustrates a schematic block diagram of a three input voltage comparator having polarity control, according to another specific example embodiment of this disclosure.

Referring now to FIG. 4, depicted is a schematic block diagram of a three input voltage comparator having polarity control, according to another specific example embodiment of this disclosure. The three input voltage comparator having polarity control, generally represented by the numeral 400, may comprise a first voltage comparator 462a, a second voltage comparator 462b, a first exclusive OR (XOR) gate 464, a second XOR gate 466, an AND gate 468 and a third XOR gate 464. It is contemplated and within the scope of this disclosure that one having ordinary skill in analog and digital semiconductor integrated circuit design and having the benefit of this disclosure could design other and alternate logic circuits having substantially the same results.

The first and second comparators 462a and 462b are "Siamese Twin" comparators in that they have separate output circuits, each having one independent input circuit, and a second common input circuit. Output drive requirements may be minimal, just enough to drive XOR gate inputs. The three input voltage comparator 400 may also include the following features according to various embodiments: 1) output polarity control; 2) output interrupt on change, and 3) connection of the output to the COG 118 auto shutdown logic. Interrupt on change is a common feature on microcontrollers. It refers to the digital input/output (I/O) ports. Generally, the microcontroller can be configured so that maybe one or two of the input ports are used as interrupt inputs (requires a logic low or a transition to logic low to generate the interrupt and you cannot use that port for anything else). This is the good old fashioned way to generate an interrupt. In addition, most of the I/O ports may be configured to further provide an "interrupt on change" function in addition to their input functionality which is different from the above interrupt input function. When this is activated any signal transition from logic low to logic high or vice versa on any of the inputs that have been configured with this function will trigger an interrupt.

The three input voltage comparator 400 shown in FIG. 4 provides for common bias, removes the requirement for one multiplexer, has common controls, and provides for polarity controls that allow multiple logic solutions when designing a switched mode power supply. When the $I_{Sense}$ input is less than the $I_{Limit}$ and $I_{Error}$ inputs the output may be at a logic high. A more complete and detailed table of input, output and polarity combinations of the three input voltage comparator 400 are shown in FIG. 5.

Figure 6:
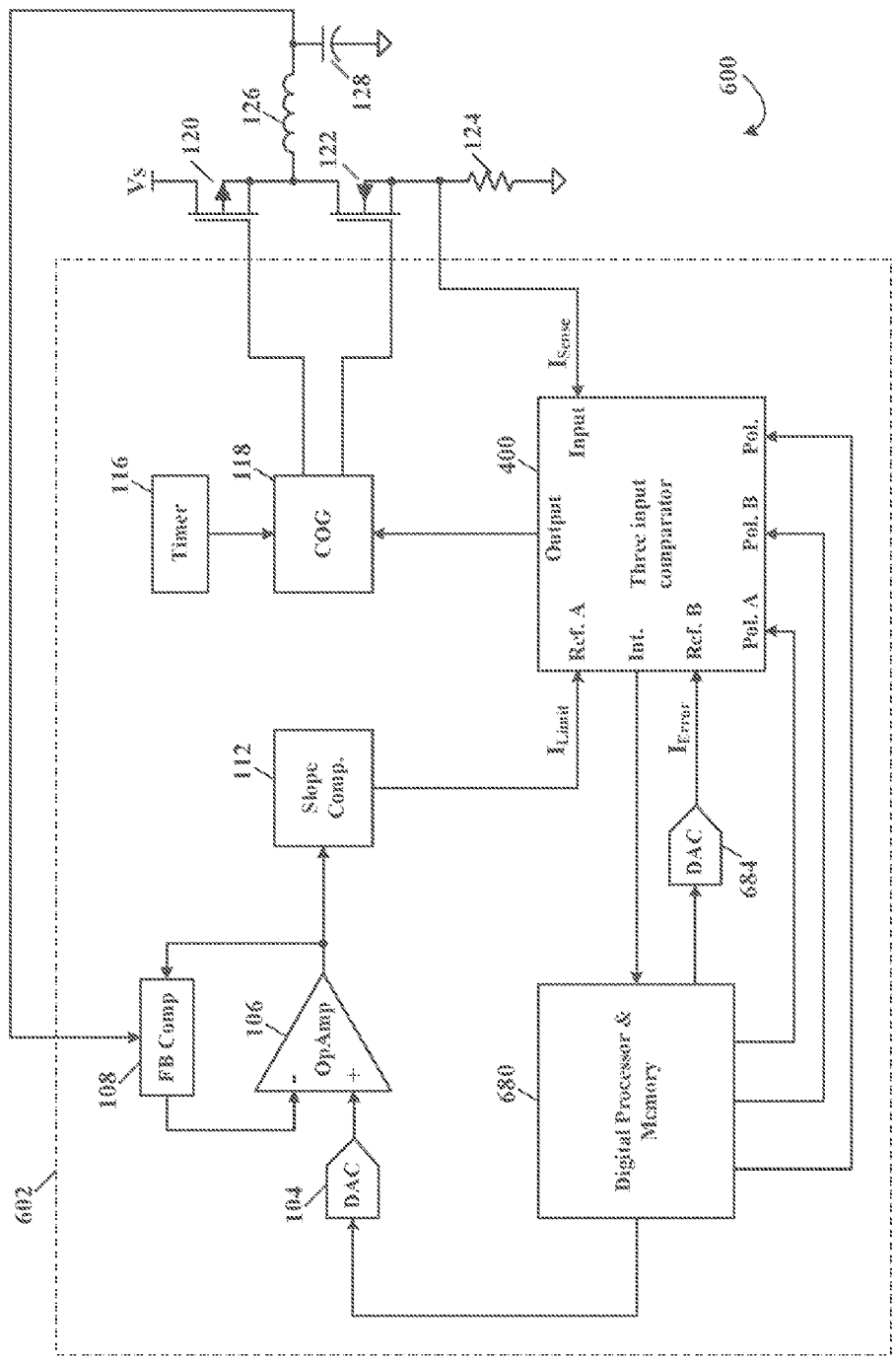
FIG. 6 illustrates a schematic block diagram of a switched mode power supply incorporating the three input voltage comparator circuit shown in FIG. 4, according to specific example embodiments of this disclosure.

Referring to FIG. 6, depicted is a schematic block diagram of a switched mode power supply incorporating the three input voltage comparator circuit shown in FIG. 4, according to specific example embodiments of this disclosure. A switched mode power supply, generally represented by the numeral 600, may comprise a microcontroller 602 that may comprise a first digital-to-analog converter (DAC) 104 for providing a fixed voltage reference to an operational amplifier (OpAmp) 106, a feedback compensation (FB Comp) network 108, a slope compensation network 112, a timer 116, a complementary output generator (COG) 118, a three input voltage comparator 400, a second DAC 684, and a digital processor and memory 680. The microcontroller 602 may further be coupled to a high-side power switch (P-channel MOSFET) 120, a low-side power switch (N-channel MOSFET) 122, a current measurement sensor (e.g., resistor) 124, a power inductor 126, and a filter capacitor 128.

In a current mode continuous current power supply design, The PWM pulse is initiated by a time-base circuit 116. While the PWM pulse is active, the current in the inductor 126 is compared to the output of the error amp/loop filter 106/108/112. When the increasing inductor 126 current is higher than the output of the amp/filter 106/108/112, the PWM pulse is terminated. Using the three input comparator 400, the third input is driven by a programmable DAC 684. When the input current is greater than the output the DAC 684, then the PWM pulse is also terminated. This secondary function is used as a current limit, so even if the OpAmp/filter 106/108 is asking for more current, the third input to the comparator 400 limits the current to a fixed maximum, providing an over current protection (current limit) safeguard.

A reference voltage from the first DAC 104 is coupled to the non-inverting input of the OpAmp 106, and a voltage on the filter capacitor 128 is coupled to the FB Comp network 108 which is further coupled to the inverting input of the OpAmp 106. The OpAmp 106 is used as a voltage error amplifier. The output of the OpAmp 106 is coupled to the slope compensation network 112 that produces a limit current ($I_{Limit}$) signal which is coupled to the reference A input of the three input voltage comparator 400. The second DAC 684 provides an error current ($I_{Error}$) signal to the reference B input of the three input voltage comparator 400. The sense current ($I_{Sense}$) signal from the current measurement sensor 124 is coupled to the input of the three input voltage comparator 400. The output of the voltage comparator 400 is coupled to the COG 118. The timer 116 controls the pulse width modulation (PWM) period from the COG 118 and the output from the three input voltage comparator 400 controls the PWM duty cycle. Whenever the sense current ($I_{Sense}$) signal is greater than the limit current ($I_{Limit}$) signal and/or the error current ($I_{Error}$) signal, the PWM output from the COG 118 will terminate.

The digital processor 680 may provide digital values to the inputs of the first DAC 104 and second DAC 684. The digital processor 680 may also provide polarity configuration information to the three polarity inputs, Pol. A, Pol. B and Pol.; of the voltage comparator 400. This polarity configuration information may be stored in the memory of the digital processor 680. An interrupt signal may be generated by the voltage comparator 400 and coupled to the digital processor, and/or when a change in logic state occurs at an input of the microcontroller 680.

The invention claimed is:
1. A three input voltage comparator, comprising:
a first input;
a second input;
a third input; and
an output having either at a first or second logic level, wherein when voltages on:
the first input is less than the second and third inputs the output is at the first logic level,
the first input is greater than the second and less than the third input the output is at the second logic level,
the first input is greater than the second and third inputs the output is at the second logic level, and
the first input is less than the second and greater than the third input the output is at the second logic level.
2. The three input voltage comparator according to claim 1, wherein the first logic level is a high logic level and the second logic level is a low logic level.
3. The three input voltage comparator according to claim 1, wherein the first logic level is a low logic level and the second logic level is a high logic level.
4. The three input voltage comparator according to claim 1, wherein the first and third inputs are non-inverting inputs and the second input is an inverting input.

5. A three input voltage comparator having output polarity control, comprising:
a first voltage comparator having a first input, a second input and a first output;
a second voltage comparator having a third input and the second input in common with the first voltage comparator, and a second output;
a first exclusive OR gate having a first input coupled to the output of the first voltage comparator and a second input coupled to a first polarity selection signal;
a second exclusive OR gate having a first input coupled to the output of the second voltage comparator and a second input coupled to a second polarity selection signal;
an AND gate having a first input coupled to an output of the first exclusive OR gate and a second input coupled to an output of the second exclusive OR gate; and
a third exclusive OR gate having a first input coupled to the output of the AND gate, a second input coupled to a third polarity selection signal, and a third output,
wherein the first and third inputs are non-inverting inputs and the second input is an inverting input.
6. The three input voltage comparator according to claim 5, wherein when a voltage on the second input is greater than voltages on the first and third inputs of the voltage comparators then the third output of the third exclusive OR gate is at a logic low when the first, second and third polarity selection signals are at the logic low.
7. The three input voltage comparator according to claim 5, wherein when a voltage on the second input is greater than a voltage on the first input and less than a voltage on the third input of the voltage comparators then the third output of the third exclusive OR gate is at a logic low when the first, second and third polarity selection signals are at the logic low.
8. The three input voltage comparator according to claim 5, wherein when a voltage on the second input is less than a voltage on the first input and greater than a voltage on the third input of the voltage comparators then the third output of the third exclusive OR gate is at a logic low when the first, second and third polarity selection signals are at the logic low.
9. The three input voltage comparator according to claim 5, wherein when a voltage on the second input is less than voltages on the first and third inputs of the voltage comparators then the third output of the third exclusive OR gate is at a logic high when the first, second and third polarity selection signals are at a logic low.
10. The three input voltage comparator according to claim 5, wherein when a voltage on the second input is greater than voltages on the first and third inputs of the voltage comparators then the third output of the third exclusive OR gate is at a logic high when the first polarity selection signal is at a logic low, and the second and third polarity selection signals are at the logic high.
11. The three input voltage comparator according to claim 5, wherein when a voltage on the second input is greater than the voltage on the first input and less than the voltage on the third input of the voltage comparators then the third output of the third exclusive OR gate is at a logic high when the first polarity selection signal is at a logic low, and the second and third polarity selection signals are at the logic high.
12. The three input voltage comparator according to claim 5, wherein when a voltage on the second input is less than the voltage on the first input and greater than the voltage on the third input of the voltage comparators then the third output of the third exclusive OR gate is at a logic low when the first polarity selection signal is at the logic low, and the second and third polarity selection signals are at a logic high.

13. The three input voltage comparator according to claim 5, wherein when a voltage on the second input is less than the voltages on the first and third inputs of the voltage comparators then the third output of the third exclusive OR gate is at a logic high when the first polarity selection signal is at a logic low, and the second and third polarity selection signals are at the logic high.

14. The three input voltage comparator according to claim 5, wherein when a voltage on the second input is greater than the voltages on the first and third inputs of the voltage comparators then the third output of the third exclusive OR gate is at a logic high when the first polarity selection signal is at the logic high, the second polarity selection signal is at a logic low, and the third polarity selection signal is at the logic high.

15. The three input voltage comparator according to claim 5, wherein when a voltage on the second input is greater than the voltage on the first input and less than the third input of the voltage comparators then the third output of the third exclusive OR gate is at a logic low when the first polarity selection signal is at a logic high, the second polarity selection signal is at the logic low, and the third polarity selection signal is at the logic high.

16. The three input voltage comparator according to claim 5, wherein when a voltage on the second input is less than the voltage on the first input and greater than the third input of the voltage comparators then the third output of the third exclusive OR gate is at a logic high when the first polarity selection signal is at the logic high, the second polarity selection signal is at a logic low, and the third polarity selection signal is at the logic high.

17. The three input voltage comparator according to claim 5, wherein when a voltage on the second input is less than the voltages on the first and third inputs of the voltage comparators then the third output of the third exclusive OR gate is at a logic high when the first polarity selection signal is at the logic high, the second polarity selection signal is at a logic low, and the third polarity selection signal is at the logic high.

18. A microcontroller comprising a digital processor and a three input voltage comparator comprising:
  a first voltage comparator having a first input, a second input and a first output;
  a second voltage comparator having a third input and the second input in common with the first voltage comparator, and a second output;
  a first exclusive OR gate having a first input coupled to the output of the first voltage comparator and a second input coupled to a first polarity selection signal;
  a second exclusive OR gate having a first input coupled to the output of the second voltage comparator and a second input coupled to a second polarity selection signal;
  an AND gate having a first input coupled to an output of the first exclusive OR gate and a second input coupled to an output of the second exclusive OR gate; and
  a third exclusive OR gate having a first input coupled to the output of the AND gate, a second input coupled to a third polarity selection signal, and a third output;
  wherein the three input voltage comparator is coupled with the digital processor, wherein the microcontroller is configured to provide the first, second and third polarity selection signals.

19. The microcontroller according to claim 18, further comprising a slope compensation network comprising an output coupled with the first input of the three input voltage comparator, a digital-to-analog converter comprising an output coupled with the third input of the three input voltage comparator, wherein the second input of the three input voltage comparator is coupled with an external pin of the microcontroller.

20. The microcontroller according to claim 19, further comprising a complementary output generator comprising an input coupled with the third output of the third exclusive OR gate.

21. A switched mode power supply comprising a microcontroller according to claim 20, further comprising series connected high side and low side power switches coupled with the complementary output controller, a current sense resistor coupled between the low side power switch and ground, wherein a node between the low side power switch and the current sense resistor is coupled with the external pin of the microcontroller.

22. The switched mode power supply according to claim 21, further comprising an inductor coupled between a node between the high side and low side power switches and a feedback compensation network within the microcontroller, and a capacitor coupled between the inductor and the ground connection.

23. The switched mode power supply according to claim 21, wherein the high side and low side power switches are MOSFETs.

* * * * *